April 8, 1958 JEAN-MARIE MOULON 2,830,134

DIRECT COUPLING TWO-STAGE TRANSISTOR AMPLIFIER

Filed Feb. 26, 1954 5 Sheets-Sheet 1

April 8, 1958 JEAN-MARIE MOULON 2,830,134

DIRECT COUPLING TWO-STAGE TRANSISTOR AMPLIFIER

Filed Feb. 26, 1954 5 Sheets-Sheet 2

April 8, 1958 JEAN-MARIE MOULON 2,830,134

DIRECT COUPLING TWO-STAGE TRANSISTOR AMPLIFIER

Filed Feb. 26, 1954 5 Sheets-Sheet 4

April 8, 1958 JEAN-MARIE MOULON 2,830,134

DIRECT COUPLING TWO-STAGE TRANSISTOR AMPLIFIER

Filed Feb. 26, 1954 5 Sheets-Sheet 5

United States Patent Office 2,830,134

Patented Apr. 8, 1958

2,830,134

DIRECT COUPLING TWO-STAGE TRANSISTOR AMPLIFIER

Jean-Marie Moulon, Paris, France

Application February 26, 1954, Serial No. 412,674

Claims priority, application France May 9, 1953

2 Claims. (Cl. 179—171)

The present invention relates to a direct coupled two-transistor amplifier assembled in such a manner that the collector electrode of the first transistor is connected directly with the emitter electrode of the second transistor, the base electrodes of both transistors being connected at a constant potential point of the mounting by means of suitably chosen impedances. Such an assembly constitutes a cascade type two-stage amplifier.

An object of the present invention is to obtain a two-transistor amplifier having a substantial current and power gain, and which can be power supplied from a single current source.

Another object of the present invention is to obtain a direct coupled two-transistor amplifier capable of operating as a D. C. amplifier. In particular, the amplifier comprises no interstage transformer and uses a single source of power supply instead of a distinct source for each stage.

It is known that an assembly of two transistors connected in cascade, and connecting on the one hand the collector electrode of the first one with the emitter electrode of the second one, and, on the other hand the base electrodes with each other, and with a constant potential point biased by a main current source connected between this point and the collector electrode of the second transistor, has no amplifying properties. If an electric signal voltage is applied between the base electrode and the emitter electrode of the first transistor, and if a load impedance is connected between the base electrode and the collector electrode of the second transistor, it is necessary in order to have an amplification, that the emitter electrode of the first transistor be positively biased with respect to its collector electrode, by means of an auxiliary current source and that a similar bias be applied to the emitter electrode of the second transistor with respect to its collector electrode by means of the main current source connected as explained above. This leads again to the drawbacks of D. C. tube amplifiers which require one current source for each stage.

According to the invention, the device which has just been described is improved by the insertion, in the circuit of the base electrode of the second transistor, of a so-called "feedback" resistance which is chosen larger than the transfer return resistance representing the action of the current in the circuit of the collector electrode on the emitter electrode voltage as this action would exist in the absence of said feedback resistance. The effect of the insertion of this resistance is to space more widely from one another the characteristic curves representing, for various values of the output current of the second transistor, the input voltage plotted against the input current supplied to said second transistor.

The result, as will be shown hereinafter, is that there corresponds, to a given variation of the input current supplied to the assembly of the two transistors, a larger variation of the output current of the assembly than in case no resistance is inserted in the base electrode circuit of the second transistor. In addition, the presence of the resistance has the effect of causing, through the assembly of the amplifier, a distribution of direct potentials which obviates the need for an auxiliary power supply source.

The invention having been briefly defined will now be described in greater detail with reference to the appended drawings, wherein.

Figure 1:
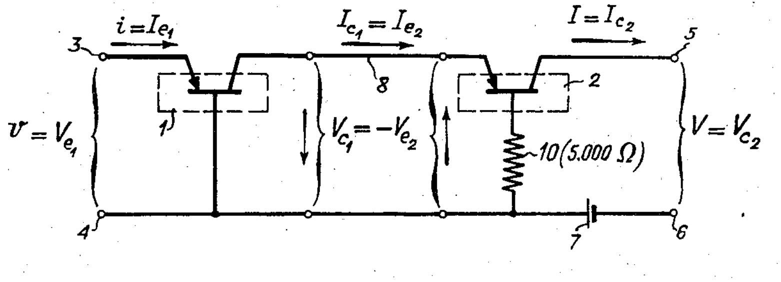
Figure 1 shows a direct coupled two-transistor amplifier according to the invention.

As shown in Figure 1, the two-stage transistor amplifier according to the invention, represented in this figure, comprises essentially two transistors 1 and 2, means comprising input terminals 3 and 4 for applying a signal voltage to be amplified between the emitter electrode of transistor 1 and the base electrode of this transistor considered as a constant potential point of the assembly, a direct connection 8 between the collector electrode of transistor 1 and the emitter electrode of transistor 2, a resistance 10 connecting the base electrode of transistor 2 with the base electrode of transistor 1, a source of direct bias voltage 7 connected by one of its terminals to said constant potential point and means comprising output terminals 5 and 6 for connecting an outer load impedance, on the one hand with the collector electrode of transistor 2 and on the other hand with the other terminal of source 7.

The operation of the amplifier of Figure 1 will first be explained as regards its D. C. characteristics, after which its operation will be considered for small alternating voltage variations and current variations occurring in the vicinity of the D. C. voltage and current conditions corresponding to predetermined power supply conditions.

All voltages, hereinafter, will be referred to terminal 4 and to the base electrode in transistor 1, considered as a zero potential point.

Designating by $V_{e_1}$ and $I_{e_1}$ the voltage and current in the circuit of the emitter electrode of the first transistor, by $V_{c_1}$ and $I_{c_1}$ the voltage and current in the circuit of the collector electrode of the same transistor, by $V_{e_2}$ and $I_{c_2}$ the voltage and current in the circuit of the collector electrode of said second transistor, the following equations may be written:

$$V_{e_2}=-V_{c_1}$$
$$I_{e_2}=I_{c_1} \quad (1)$$

Figure 2:
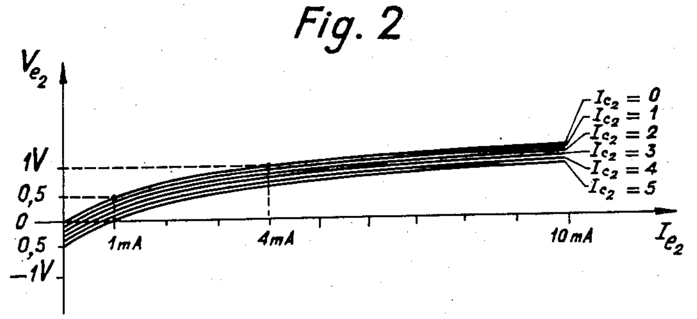
Figure 2 shows the characteristic curves giving, for various values of the output current from the second transistor, the input voltage as a function of the input current to said second transistor in case there is no resistance in its base electrode circuit.
Figure 3:
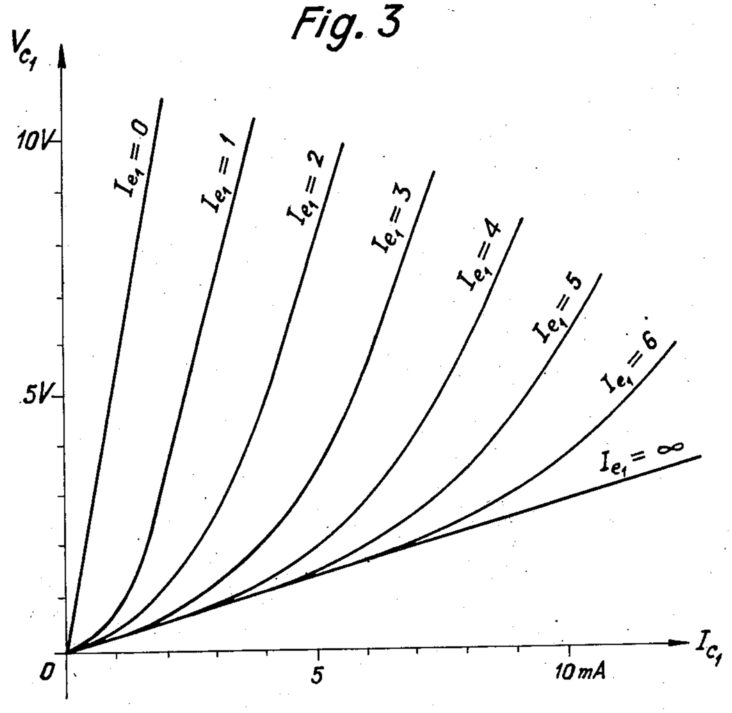
Figure 3 represents the characteristic curves giving, for various values of the input current to the first transistor, the output voltage as a function of the output current from this first transistor.

Figure 2 shows the group of $V_{e2}-I_{e2}$ characteristics for various values of $I_{c2}$ for a transistor of a common type, and Figure 3 shows the group of characeristic curves $V_{c1}-I_{c1}$ for various values of $I_{e1}$.

Figure 4:
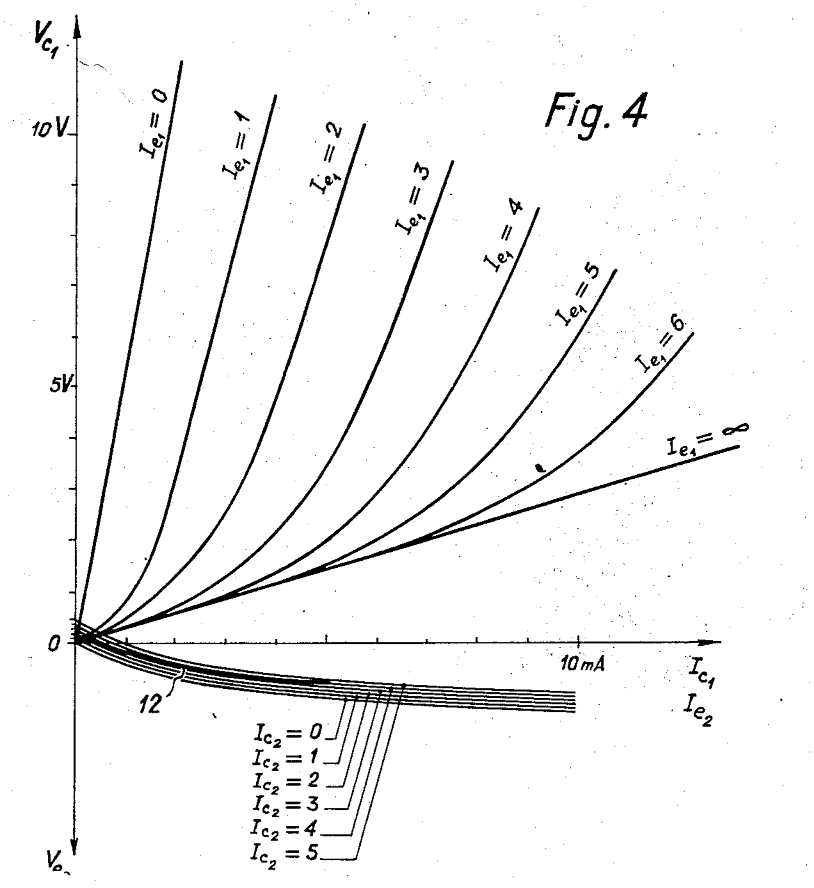
Figure 4 is a superposition, made in conditions which will be explained hereinafter, of the characteristic curves of Figures 2 and 3.

In Figure 4, these two groups of characteristic curves have been superposed by bringing the axes $I_{c1}$ and $I_{e2}$ to coincidence, since the currents are the same in the collector electrode of the transistor 1 and in the emitter electrode of the transistor 2, and by opposing the axes $V_{c1}$ and $V_{e2}$ in order to take into account the first relationship (1).

If a certain load impedance is connected to the output terminals 5—6, there corresponds thereto, in the $V_{e2}$ and $I_{e2}$ curve group of Figures 2 and 4, a certain load curve 12 which depends on the value of the impedance of the connected load and on the electromotive force of the source 7. Whichever this curve may be, it is obvious from Figure 4, there corresponds that to any variation of $I_{e1}$ on this curve only a very low variation of $I_{c2}$ as the $V_{e2}-I_{e2}$ characteristics intersect the $V_{c1}-I_{c1}$ characteristics in the area close to the origin, where the latter are not yet distant from one another. This is due to the fact that the transistor 1 is not biased normally.

Figure 5:
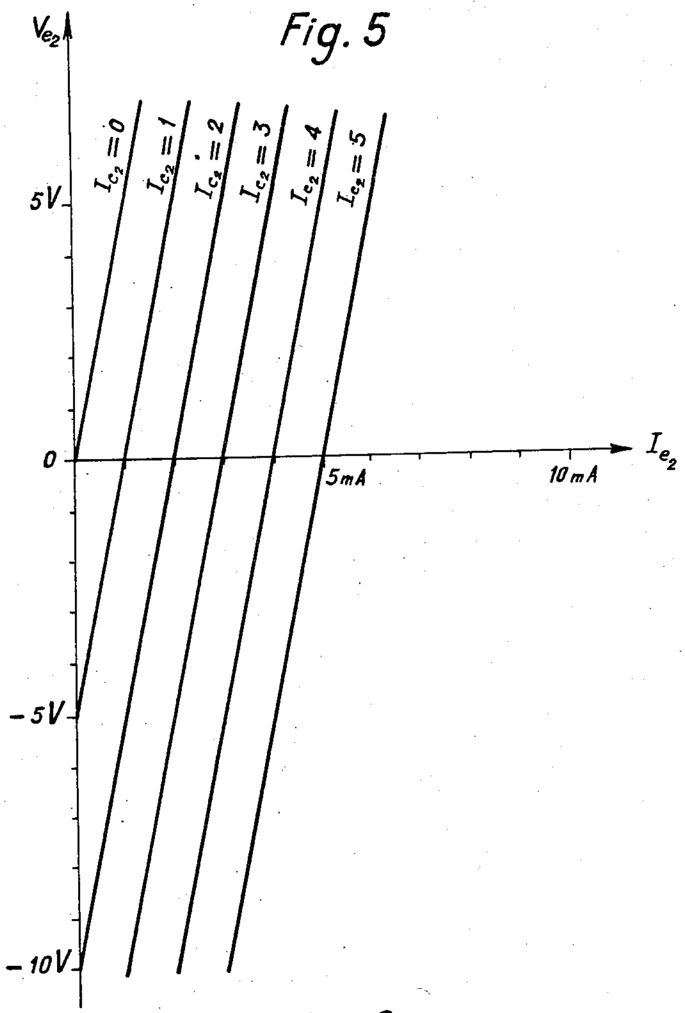
Figure 5 shows the characteristic curves giving, for various values of the output current from the second transistor having a resistance in its base electrode circuit, the input voltage as a function of the input current to said second transistor.
Figure 6:
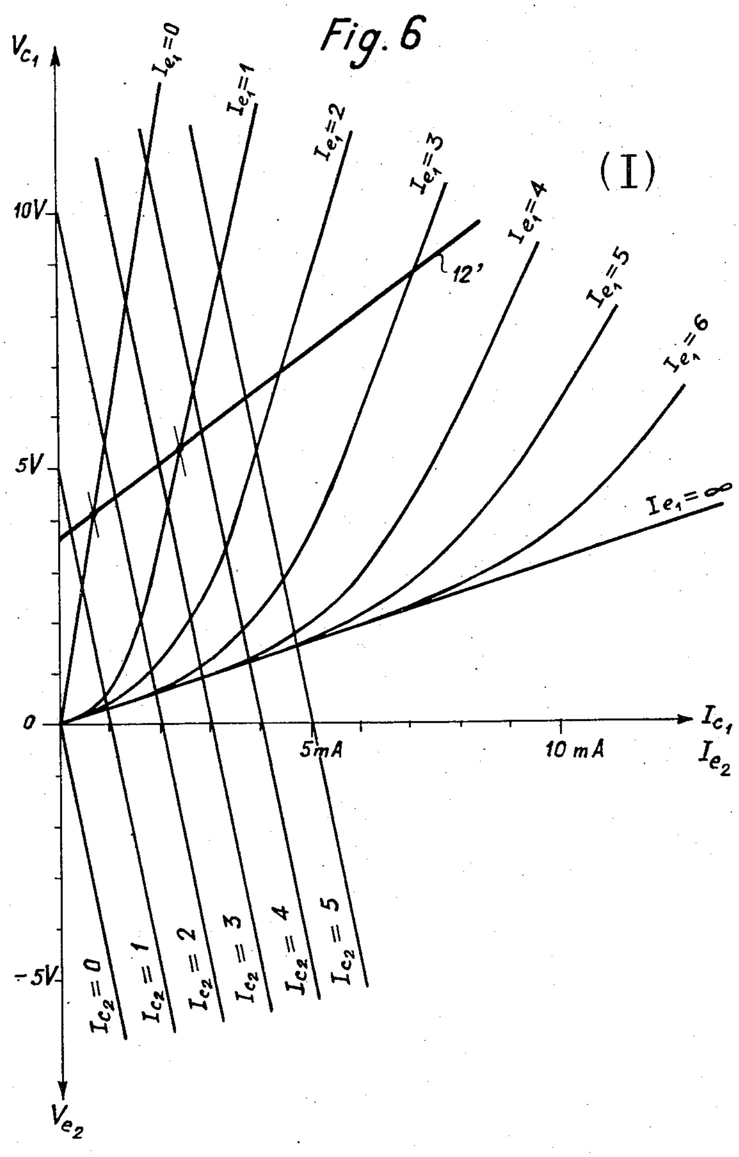
Figure 6 is a superposition made in conditions which will be set forth hereinafter, of the characteristic curves of Figures 3 and 5.

In order that a variation of $I_{e1}$ may cause a substantial variation of $I_{c2}$, it is necessary to increase the spacing between the characeristic $V_{e2}-I_{e2}$ curves corresponding to different values of $I_{c2}$. This result is obtained, according to the invention, by inserting a feedback resistance 10 of the order of 5,000 ohms in the circuit of the base electrode of transistor 2 (Fig. 1). Such a resistance increases the action of the current in the collector electrode circuit on the voltage of the emitter electrode, and consequently has the effect of increasing the spacings between the characteristics of the $V_{e2}-I_{e2}$ network. This new network is shown in Figure 5, and it is also shown in Figure 6, in superposition on the network of characteristics $V_{c1}-I_{c1}$. By comparing Figures 4 and 6, it is found that the two networks $V_{c1}-I_{c1}$ and $V_{e2}-I_{e2}$ have a wide area in common in the first quadrant, numbered (I) in the case of Figure 6. The load curve represented at 12' offers a negative slope due to the positive feedback introduced by the resistance inserted in the base circuit of the transistor 2.

A variation in $I_{e1}$ is then reflected on the current $I_{c2}$. For example (Fig. 6), for $I_{e1}=0$, $I_{c2}=1.5$ ma. and for $I_{e1}=1$ ma., $I_{c2}=3.5$ ma. The current gain may be increased, generally, by modifying the slope of the curve 12', i. e. by matching as well as possible the value of the load impedance connected to terminals 5 and 6.

The advantage concerning the current gain obtained by the set up of Figure 1 as compared to the set up including no resistance 10, for the case of small voltage and current variations about a working point in the system will be made clear hereinafter.

It will be assumed that the transistors 1 and 2 have average characteristics, for instance an input resistance $R_{11}=300$ ohms, an output resistance $R_{22}=10{,}000$ ohms and transfer resistances $R_{12}$ and $R_{21}$ translating respectively the action of the circuit of the collector electrode on the voltage of the emitter electrode and the action of the emitter electrode circuit on the voltage of the collector electrode, respectively equal to 100 and 20,000 ohms. As a result, the current gain of each transistor $a=R_{21}/R_{22}$ is equal to 2. It will be assumed further that the resistance 10 inserted in the base electrode circuit of the second transistor has, for instance, a value R equal to 5,000 ohms. Under these conditions, the impedance matrix of the first transistor may be written:

$$\begin{Vmatrix} R_{11} & R_{12} \\ R_{21} & R_{22} \end{Vmatrix} = \begin{Vmatrix} 300 & 100 \\ 20{,}000 & 10{,}000 \end{Vmatrix} \quad (2)$$

and that of the second transistor is obtained by adding the quantity R, i. e. 5,000 ohms to all terms of the matrix (2) which gives neglecting 300 ohms and 100 ohms as compared to 5,000 ohms:

$$\begin{Vmatrix} R_{11}+R & R_{12}+R \\ R_{21}+R & R_{22}+R \end{Vmatrix} = \begin{Vmatrix} R'_{11} & R'_{12} \\ R'_{21} & R'_{22} \end{Vmatrix} \approx \begin{Vmatrix} 5{,}000 & 5{,}000 \\ 25{,}000 & 15{,}000 \end{Vmatrix}$$

Taking into account the fact that the characteristic matrix of two four-terminal networks connected in chain is equal to the product of the characteristic matrices of the two four-terminal networks of the chain and the relationship existing between a characteristic matrix and an impedance matrix for a given network, and if:

$$\begin{Vmatrix} S_{11} & S_{12} \\ S_{21} & S_{22} \end{Vmatrix}$$

is the impedance matrix for the chain, we have:

$$S_{11}=R_{11}-\frac{R_{12}R_{21}}{R_{22}+R'_{11}}=300-\frac{100\times 20{,}000}{10{,}000+5{,}000}=160 \text{ ohms}$$

$$S_{12}=\frac{R_{12}R'_{12}}{R_{22}+R'_{11}}=\frac{100\times 5{,}000}{10{,}000+5{,}000}=33 \text{ ohms}$$

$$S_{21}=\frac{R_{21}R'_{21}}{R_{22}+R'_{11}}=\frac{20{,}000\times 25{,}000}{10{,}000+5{,}000}=33{,}000 \text{ ohms}$$

$$S_{22}=R'_{22}-\frac{R'_{12}R'_{21}}{R_{22}+R'_{11}}=15{,}000-\frac{5{,}000\times 25{,}000}{10{,}000+5{,}000}=6{,}700 \text{ ohms}$$

whence:

$$\begin{matrix} S_{11} & S_{12} \\ S_{21} & S_{22} \end{matrix} = \begin{matrix} 160 & 33 \\ 33{,}000 & 6{,}700 \end{matrix} \quad (3)$$

Comparing the impedance matrix (3) with the impedance matrix (2) of the transistors 1 and 2, we find that:

—the current gain passed from $a=R_{21}/R_{22}=2$ to $a'=S_{21}/S_{22}=5$

—the short circuit stability coefficient $\delta$ is lower for the assembly of the two transistors than for a single transistor since $$\delta=\frac{R_{12}R_{21}}{R_{11}R_{22}}=\frac{100\times 20{,}000}{300\times 10{,}000}=0.67$$

for a single transistor, while:

$$\delta'=\frac{S_{12}S_{21}}{S_{11}S_{22}}=\frac{33\times 33{,}000}{160\times 6{,}700}=1$$

for the two transistor assembly.

This short-circuit stability coefficient $\delta'$, which may seem too large, is not prohibitive, however, as it is possible on the one hand, to choose transistors for which the term $R_{12}$ is less than 100 ohms. On the other hand, the stability coefficient decreases substantially if the resistances of the source connected to the input and of the load connected to the output of the two-transistor assembly are no longer zero but have, for instance, a value equal to 600 ohms. This coefficient then becomes:

$$\Delta=\frac{33\times 33{,}000}{(160+600)(6{,}700+600)}=0.195\ll 1$$

Figure 8:
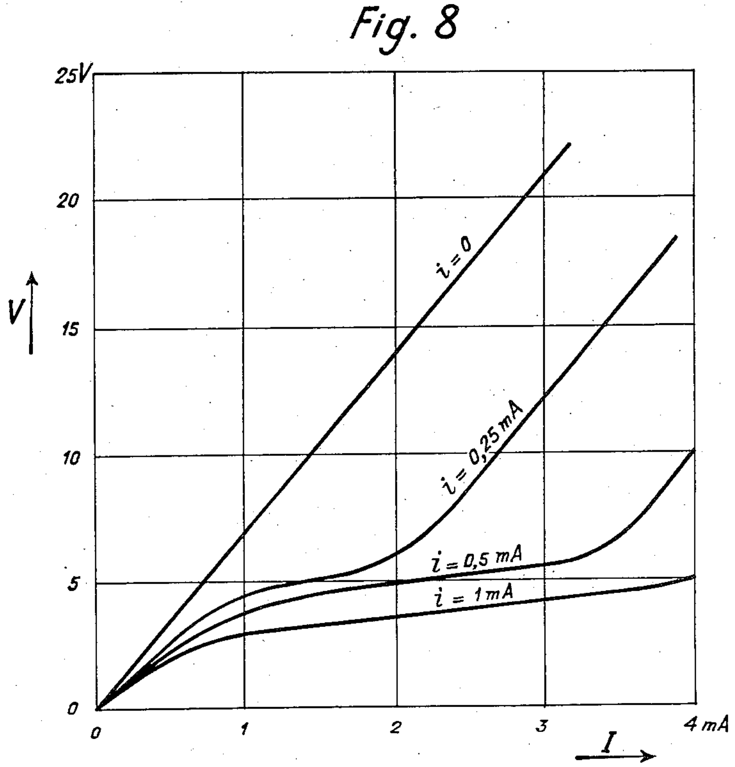
Figures 7 and 8 represent, respectively the input and output "voltage-current" characteristics of the two-transistor amplifier of Figure 1.
Figure 7:
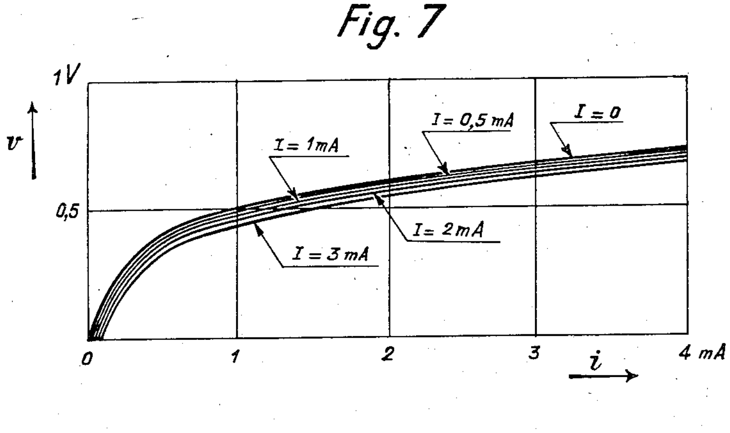

There is plotted, for the above numerical values, in Figure 8, the network of characteristics giving V (output voltage) as a function of I (output current) of the two-transistor assembly for various values of the input current $i$. On Figure 7 is plotted the network of characteristics giving $v$ (input voltage) as a function of $i$ (input current) of this same assembly for various values of the output current I. On these networks of characteristics, which are similar to those for a single transistor, may be found the above calculated performances. The output impedance given by the slope of the characteristics of Figure 8 is of the order of 7,000 ohms. The current gain is of the order of 5; the characteristics corresponding to $i=0$ and $i=0.25$ ma. for instance, are spaced by 1.25 ma. parallel to the I axis. The power gain G is important; it is given, assuming for instance the two-transistor assembly connected with a source having an internal resistance $r=160$ ohms, and a load resistance $r'=6{,}700$ ohms, by $$G=\left[\frac{(r+r')S_{21}}{(S_{11}+r)(S_{22}+r')-S_{12}S_{21}}\right]^2=\left[\frac{6{,}860\times 33{,}000}{320\times 1{,}400-33\times 33{,}000}\right]^2=70^2$$

$G=37$ decibels

It appears from the above that the direct coupled two-transistor assembly according to the invention behaves like an improved transistor with important current and power gains. It may be used, therefore, in all set-ups using transistors by a simple substitution for a single transistor, and it may be power supplied from a single current source like the single transistor for which it is substituted.

Figure 9:
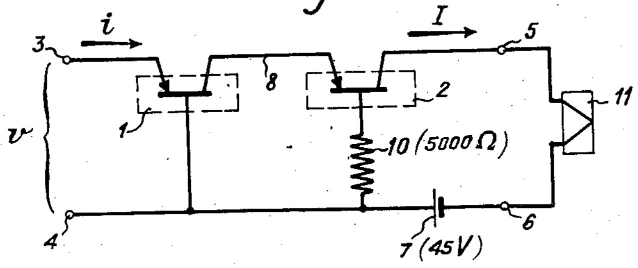
Figure 9 represents an assembly of two transistors according to the invention, used for controlling a telephone relay or repeater.

The two-transistor assembly may be used for subjecting the D. C. in the collector electrode circuit of the second transistor to important power variations derived from small power variations in the input circuit. In Figure 9, 11 represents a relay winding having a 4,000 ohm resistance inserted in the collector electrode circuit of transistor 2, the other reference numerals being the same as in Fig. 1. For a power variation at the input of the order of 10 milliwatts, power variations are obtained in the relay circuit of the order of 150 milliwatts, sufficient for controlling the relay.

What is claimed is:

1. A two stage transistor amplifier comprising first and second transistors; each of said transistors having base, emitter and collector electrodes; input terminals for applying a signal voltage to be amplified between the base and emitter electrodes of said first transistor; a biasing direct current source for supplying biasing current to said transistors; a utilization circuit; connections for connecting said utilization circuit in series with said source between the collector electrode of said second transistor and the base electrode of said first transistor, a direct connection between said collector electrode of said first transistor and said emitter electrode of said second transistor; a resistor connected between the respective base electrodes of said first and second transistors.

2. An amplifier as claimed in claim 1, wherein the resistance value of said resistor is of the same order of magnitude as the internal dynamic collector-base electrode resistance of said second transistor in its normal amplifying condition.

References Cited in the file of this patent

UNITED STATES PATENTS

| | | |
|---|---|---|
| 2,585,078 | Barney | Feb. 12, 1952 |
| 2,622,213 | Harris | Dec. 16, 1952 |
| 2,666,817 | Raisbeck et al. | Jan. 19, 1954 |